(12) United States Patent
Chung et al.

(10) Patent No.: US 10,770,476 B1
(45) Date of Patent: Sep. 8, 2020

(54) SEMICONDUCTOR STRUCTURE FOR THREE-DIMENSIONAL MEMORY DEVICE AND MANUFACTURING METHOD THEREOF

(71) Applicant: MACRONIX International Co., Ltd., Hsinchu (TW)

(72) Inventors: Yao-An Chung, Hsin-chu (TW); Yuan-Chieh Chiu, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/371,579

(22) Filed: Apr. 1, 2019

(51) Int. Cl.
*H01L 27/11582* (2017.01)
*H01L 29/792* (2006.01)
*H01L 27/11568* (2017.01)
*H01L 21/28* (2006.01)

(52) U.S. Cl.
CPC .. *H01L 27/11582* (2013.01); *H01L 27/11568* (2013.01); *H01L 29/40117* (2019.08); *H01L 29/7926* (2013.01)

(58) Field of Classification Search
None
See application file for complete search history.

(56) References Cited

U.S. PATENT DOCUMENTS

| 9,530,789 B2 | 12/2016 | Lee et al. | |
| 9,741,734 B2 | 8/2017 | Zhu et al. | |
| 9,929,177 B2 | 3/2018 | Nagumo | |
| 10,134,758 B2 | 11/2018 | Zhu et al. | |
| 2011/0065270 A1* | 3/2011 | Shim | H01L 27/11556 438/589 |
| 2011/0086490 A1 | 4/2011 | Wang et al. | |
| 2017/0170190 A1 | 6/2017 | Zhu et al. | |
| 2017/0309638 A1 | 10/2017 | Nagumo | |
| 2018/0130819 A1 | 5/2018 | Zhu et al. | |
| 2018/0175050 A1* | 6/2018 | Son | H01L 27/11529 |
| 2019/0148401 A1* | 5/2019 | Lei | H01L 27/11582 257/314 |
| 2019/0279996 A1* | 9/2019 | Yamashita | H01L 27/11575 |

FOREIGN PATENT DOCUMENTS

| TW | I433274 | 4/2014 |
| TW | I624007 | 5/2018 |
| WO | 2017105737 | 6/2017 |

* cited by examiner

*Primary Examiner* — J. E. Schoenholtz
(74) *Attorney, Agent, or Firm* — J.C. Patents

(57) ABSTRACT

A semiconductor structure for three-dimensional memory device and a manufacturing method thereof are provided. In the manufacturing method, clean plasma is used to clean the impurity doped regions, formed by slit etching, in the surface layer of the substrate to decrease the contact resistance between substrate and conductive plugs formed in the slits. The bottom part of the conductive plugs each has a reduced neck structure and an enlarged bottom structure.

17 Claims, 8 Drawing Sheets

SEMICONDUCTOR STRUCTURE FOR THREE-DIMENSIONAL MEMORY DEVICE AND MANUFACTURING METHOD THEREOF

BACKGROUND

1. Field of the Invention

This disclosure is related to a semiconductor structure and a method of manufacturing the same, especially related to a semiconductor structure for a three-dimensional memory device and a method of manufacturing the same.

2. Description of Related Art

Since a non-volatile memory device has the advantage that stored data does not disappear at power-off, it becomes a widely used memory device for a personal computer or other electronic equipment. Besides, to further enhance the degree of integration of a memory device, a three-dimensional non-volatile memory is developed. However, there are still some challenges associated with three-dimensional non-volatile memory.

SUMMARY

The present disclosure provides a semiconductor structure for a three-dimensional memory device and a method of manufacturing the same, which solves the problem that the contact resistance is increased due to impurities left in the surface layer of the substrate by slit etching.

The above semiconductor structure for a three-dimensional memory device comprises a substrate, a stacked structure, a plurality of channel pillars, a plurality of isolating insulation layers, and a plurality of conductive plugs. The stacked structure is disposed on the substrate. The stacked structure comprises a plurality of insulation layers and a plurality of control gate layers which are alternatively stacked, and the stacked structure has a plurality of channel openings vertically penetrating the stacked structure, and a plurality of slits between the adjacent two rows of channel openings and vertically extending through the stacked structure. A plurality of channel pillars are respectively located in the plurality of channel openings and contact the substrate, wherein the plurality of channel pillars each sequentially comprises a blocking insulation layer, a charge trapping layer, a tunneling insulation layer, a channel layer, and a core layer, from outside to inside. A plurality of isolating insulation layers are respectively disposed on the inner walls of the plurality of slits. A plurality of conductive plugs are respectively located between the plurality of isolating insulation layers, and a bottom part of each of the conductive plugs has a reduced neck structure and a bottom structure that is further enlarged and extends into the substrate.

According to some embodiments, the slit has an aspect ratio of 30-60.

According to some other embodiments, the slit has a depth of 3 to 12 μm.

According to yet some other embodiments, the bottom structure of the conductive plug extends into the substrate to a depth of 30-800 Å.

The above method of manufacturing a semiconductor structure for a three-dimensional memory device comprises the following steps. A stacked structure is formed on a substrate. The stacked structure comprises a plurality of insulation layers and a plurality of sacrificial layers which are alternatively stacked. A plurality of channel openings vertically penetrating the stacked structure are formed and the substrate is exposed. A blocking insulation layer, a charge trapping layer, a tunneling insulation layer, a channel layer, and a core layer, from outside to inside, are formed in each of the plurality of the channel openings. A plurality of slits vertically extending through the stacked structure are formed to expose the substrate. The plurality of slits are located between adjacent two columns of the channel openings, and each of the exposed substrate has an impurity doped region in the surface layer of the exposed substrate. The plurality of sacrificial layers in the stacked structure are removed. A plurality of control gate layers between adjacent two of the insulation layers are formed. A plurality of isolating insulation layers are formed on the inner surface of the plurality of slits. Each of the isolating insulation layers on the surface of the substrate is then etched to form a slit opening to expose the substrate. The impurity doped region in the surface layer of the substrate is removed to form a bottom opening. A plurality of conductive plugs are formed between the isolating insulation layers in each of the slits, and the conductive plugs each has a reduced neck structure located in the slit opening and an enlarged bottom structure located in the bottom opening.

According to some embodiments, the removal of the impurity doped region comprises dry etching using a clean plasma.

According to some other embodiments, a biasing power of the accelerated electric field for the clean plasma is 30-100 W, and the plasma generator frequency is 0.1-60 MHz.

According to yet some other embodiments, when the impurities in the impurity doped region contains carbon and fluorine, the gas source of the clean plasma comprises a halogen-containing gas and a hydrogen-containing gas.

According to yet some other embodiments, the gas source for cleaning the plasma further comprises an inert gas.

According to yet some other embodiments, the forming the plurality of conductive plugs further comprises forming a metal silicide on the surface of the substrate.

Based on the above, in the manufacturing method of the semiconductor structure of the three-dimensional memory device, a clean plasma is used to remove the impurity doped region generated in the slit etching step to reduce the contact resistance between the conductive plugs and the substrate.

The above described features and advantages of the present invention will be more apparent from the following description.

DESCRIPTION OF THE EMBODIMENTS

In the process of forming a three-dimensional NAND memory with a vertical channel, slit etch, or called as deep trench etch, is used to create slits in a stacked structure, having silicon oxide layers and silicon nitride layers stacked alternately on a substrate, to divide channel pillars into groups. The aspect ratio of the slits is often higher than 30 and is defined to be a ratio of the total depth over the bottom critical dimension (BCD) of the slits. Since the high aspect ratio of the slits, it is necessary to use an etching plasma with higher bias energy to provide strong anisotropic etching capability, and thus some impurities from the etching chemicals of the etching plasma can penetrate the surface layer of the substrate exposed by the slits. These remaining impurities will affect the subsequent formation of metal silicide on the substrate surface to increase the contact resistance of the later formed conductive plug and the surface layer of the substrate, and the operational performance of the memory is thus affected.

FIGS. 1A-1F are schematic cross-sectional views showing a manufacturing process of a semiconductor structure according to an embodiment of the invention. The semiconductor structure of the present invention can be used for a three-dimensional memory device, and therefore will be described below by accompanying with a manufacturing process of the three-dimensional memory device.

Figure 1A:
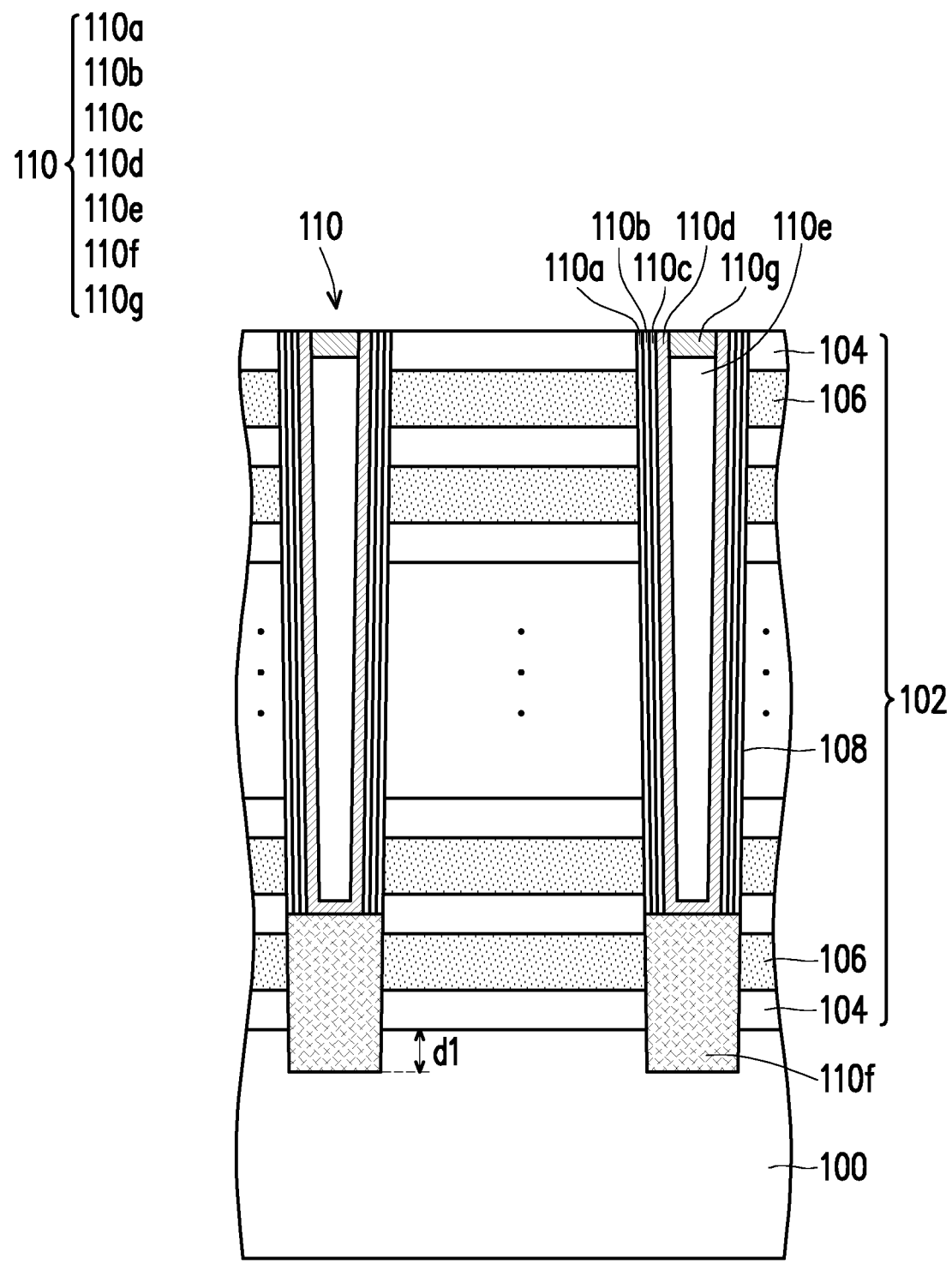
FIGS. 1A-1F are schematic cross-sectional views showing a manufacturing process of a semiconductor structure according to an embodiment of the invention.

In FIG. 1A, a stacked structure 102 is first formed on a substrate 100. The substrate 100 may be, for example, a single crystal silicon substrate. Doped regions (not shown in the figure) may be formed first in the substrate 100, depending on design requirements. The stacked structure 102 includes a plurality of insulation layers 104 and a plurality of sacrificial layers 106 that are alternately stacked. According to some embodiments, the insulation layer 104 may be, for example, a silicon oxide layer, and the sacrificial layer 106 may be, for example, a silicon nitride layer. The sacrificial layers 106 will become formation regions of control gates in the process of forming the three-dimensional memory device, and the insulation layers 104 are used to isolate the control gates. The formation method of the insulation layers 104 and the sacrificial layers 106 may be, for example, chemical vapor deposition (CVD). The respective thicknesses of the insulation layers 104 and the sacrificial layers 106 may be adjusted according to actual needs.

Next, a plurality of channel holes 108 are formed to vertically penetrate the stacked structure 102 and extend into the substrate 100 having a first depth d1 to expose the substrate 100. The first depth d1 is about 300-1500 Å. The channel holes 108 are formed by, for example, forming a patterned hard mask layer (not shown in the figure) on the stacked structure 102, and then performing an anisotropic etching process by using the hard mask layer as an etching mask. After the channel holes 108 are formed, the patterned hard mask layer is removed. Then, in each of the channel holes 108, a bottom layer 100f, such as a single crystal silicon layer, may be formed on the bottom of the channel holes 108. Then, a blocking insulation layer 110a, a charge trapping layer 110b, a tunneling insulation layer 110c, a channel layer 110d, and a core layer 110e are sequentially formed along the sidewall, from the outside to the inside of the channel hole 108, and a conductive plug 110g is formed on the core layer 110e to obtain the structure of the channel pillars 110. In some embodiments, the channel pillars 110 are also referred to as vertical channels (VCs). In order to simplify the drawing, the above detailed structures of the channel pillar 110 are only depicted in FIG. 1A and omitted in the following FIGS. 1B-1F. The blocking insulation layer 110a, the charge trapping layer 110b, the tunneling insulation layer 110c, the channel layer 110d, the core layer 110e and the conductive plug 110g above may be, for example, a silicon oxide layer, a silicon nitride layer, a silicon oxide layer, a polysilicon layer, a silicon oxide layer, and a doped polysilicon layer, respectively.

Figure 1B:
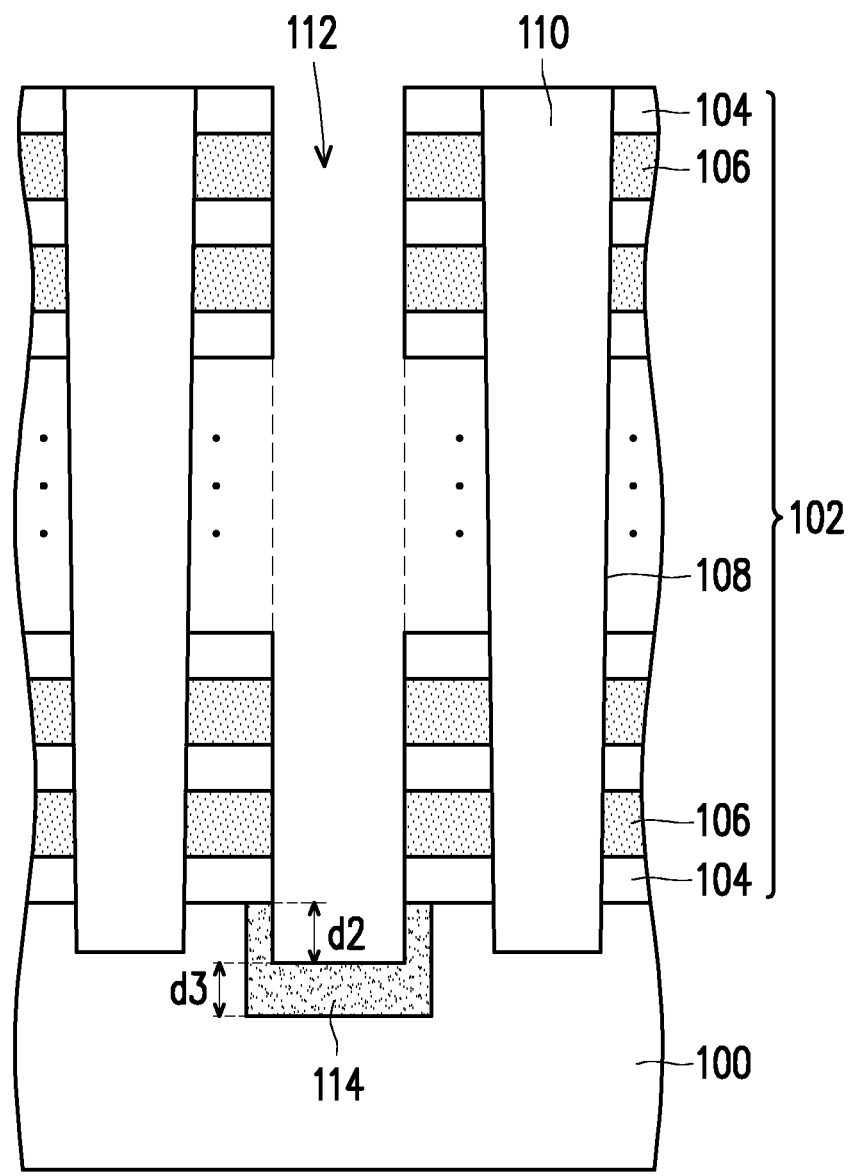
Figure 2:
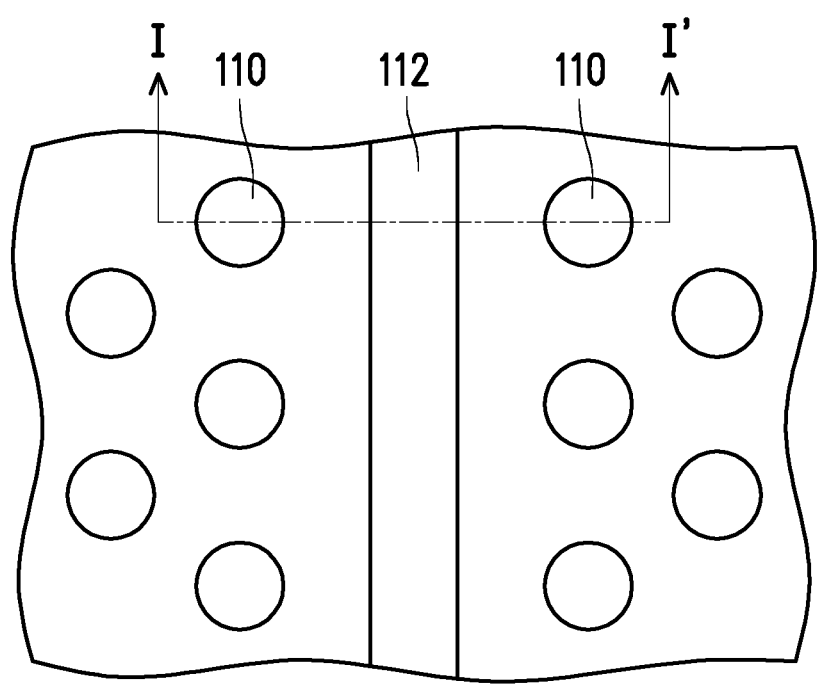
FIG. 2 is a plan view of FIG. 1B.

FIG. 2 is the plan view of FIG. 1B, and FIG. 1B is the cross-sectional diagram of the cutting line I-I'. In FIG. 1B, slit etch is performed to form a slit 112 extending through the stacked structure 102 and into the substrate 100 having a second depth d2 to expose the substrate 100, and the slits 112 separate adjacent two groups of the channel pillars 110 in FIG. 2. The slits 112 typically has a height of at least 3 μm above the interface between the substrate 100 and the insulation layer 104, and the second depth d2 is about 100-500 Å. According to some embodiments, the height of the slits 112 may be, for example, 3-12 μm, 3-10 μm, 3-8 μm, or 3-6 μm. The slits 112 have an aspect ratio of at least 30 and may be, for example, 30-60, 30-55, 30-50, 30-45 or 30-40. The slit etching is usually performed by dry etching using a plasma, and the gas source for generating the plasma may be, for example, a combination of various fluorinated carbon gases (e.g., CxFy), an oxygen-containing gas (e.g., $O_2$ or CO) and an inert gas (e.g., $N_2$, He, Ar, or Kr).

Figure 3:
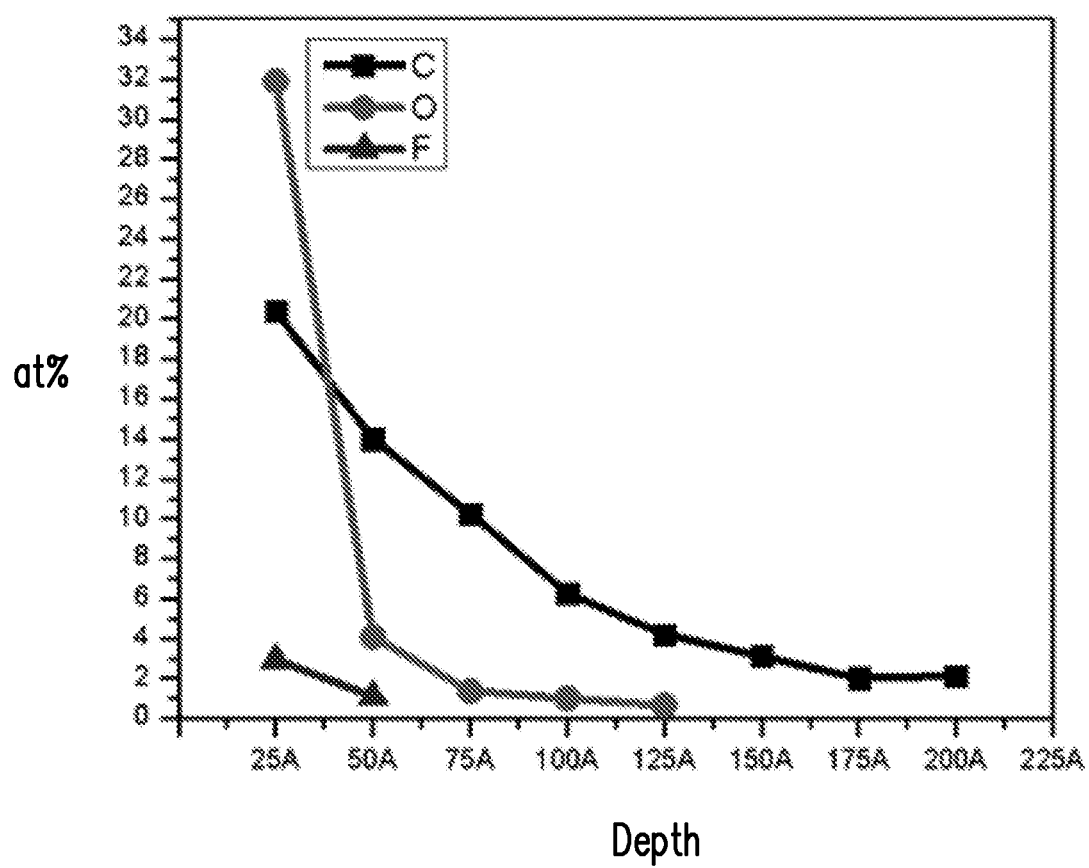
FIG. 3 is a plot of the impurity content in the substrate at the bottom of the slit as a function of the substrate depth after the slit etch is performed.

In this step, since the slits 112 have the characteristics of the depth and the aspect ratio above, the applied electric field for accelerating the etching plasma needs to have a bias acceleration power of at least 9000 W (for example, 9000-15000 W, such as 9000, 10000, 11000, 12000, 13000, 14000, or 15000 W), and the plasma generator frequency is usually smaller than 60 MHz (for example, 0.4-60 MHz, such as 0.4, 0.8, 1, 5, 10, 15, 20, 25, 30, 35, 40, 45, 50, 55, or 60 MHz). Hence, the stacked structure 102 can be etched through to expose the surface of the substrate 100. However, as a result, species in the plasma used for etching will also bombard the surface of the substrate 100 and thus left in the surface layer of the exposed regions of the substrate 100, and impurity doped regions 114 penetrating the exposed substrate 100 to a third depth d3 are therefore formed. The third depth d3 is usually less than 500 Å, such as about 200 Å, and the distribution profiles of the impurities concentrations in the substrate 100 are shown in FIG. 3. Please refer to FIG. 3. It can be seen from FIG. 3 that there are mainly three kinds of impurities, i.e. oxygen, carbon and fluorine, and the distribution depth of these impurities can be more than 200 Å.

Figure 1C:
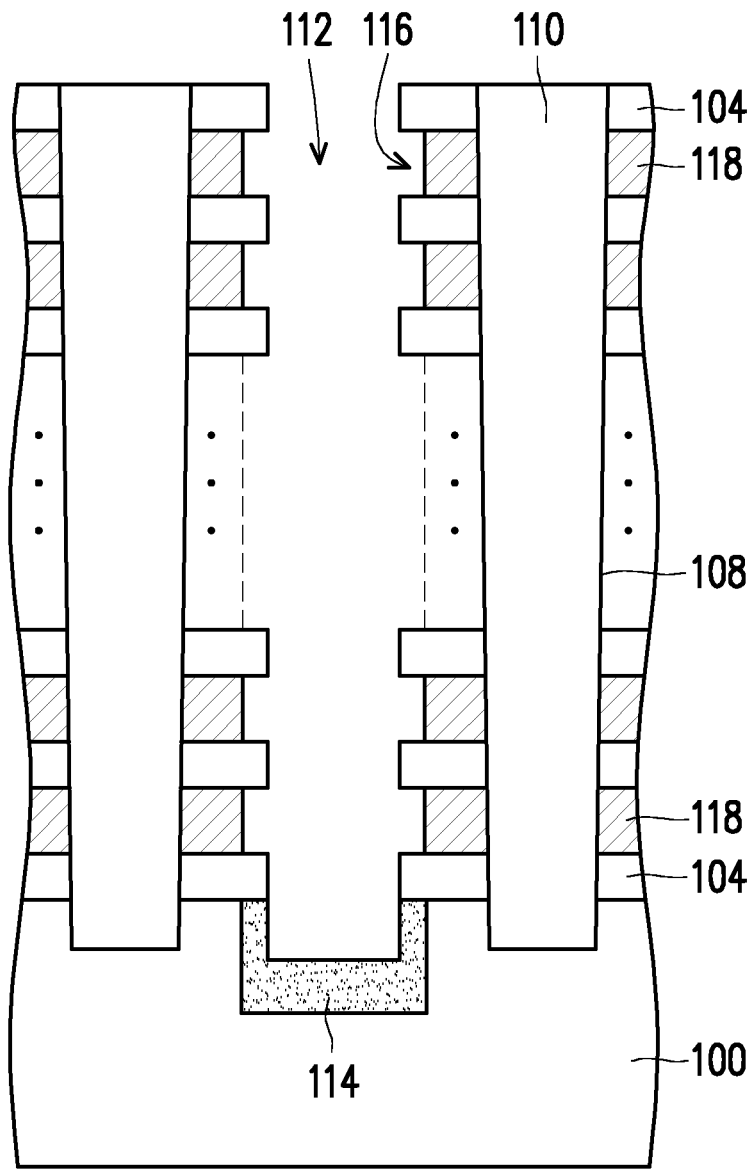

In FIG. 1C, the sacrificial layers 106 between the insulation layers 104 are removed to form gaps 116 between adjacent insulation layers 104. The method of removing the sacrificial layers 106 may be an isotropic etching, such as wet etching using $H_3PO_4$-based solution.

Next, a dielectric layer (not shown in figure) having a high dielectric constant and a metal barrier layer (not shown in figure) are sequentially formed on the exposed surfaces of the insulation layer 104 and the channel pillar 110 to surround the insulation layer 104 and the channel pillars 110. Then, a metal layer is formed to fill the gap 116. Next, the metal layer and the metal barrier layer are etched back to withdraw the metal layer and the metal barrier layer between the insulation layers 104 inward to form control gate layers 118 separated by the adjacent insulation layers 104. The dielectric layer having a high dielectric constant above comprises a metal oxide, such as aluminum oxide, hafnium oxide, zirconium oxide, tantalum pentoxide, and any combinations thereof. The material of the metal barrier layer above may be, for example, cobalt, tantalum, niobium, tantalum nitride, indium oxide, tungsten nitride, titanium nitride or any combinations thereof. The material of the metal layer above is, for example, tungsten, molybdenum, ruthenium, cobalt, or aluminum, and the method of forming the metal layer may be, for example, chemical vapor deposition, or atomic layer deposition.

Figure 1D:
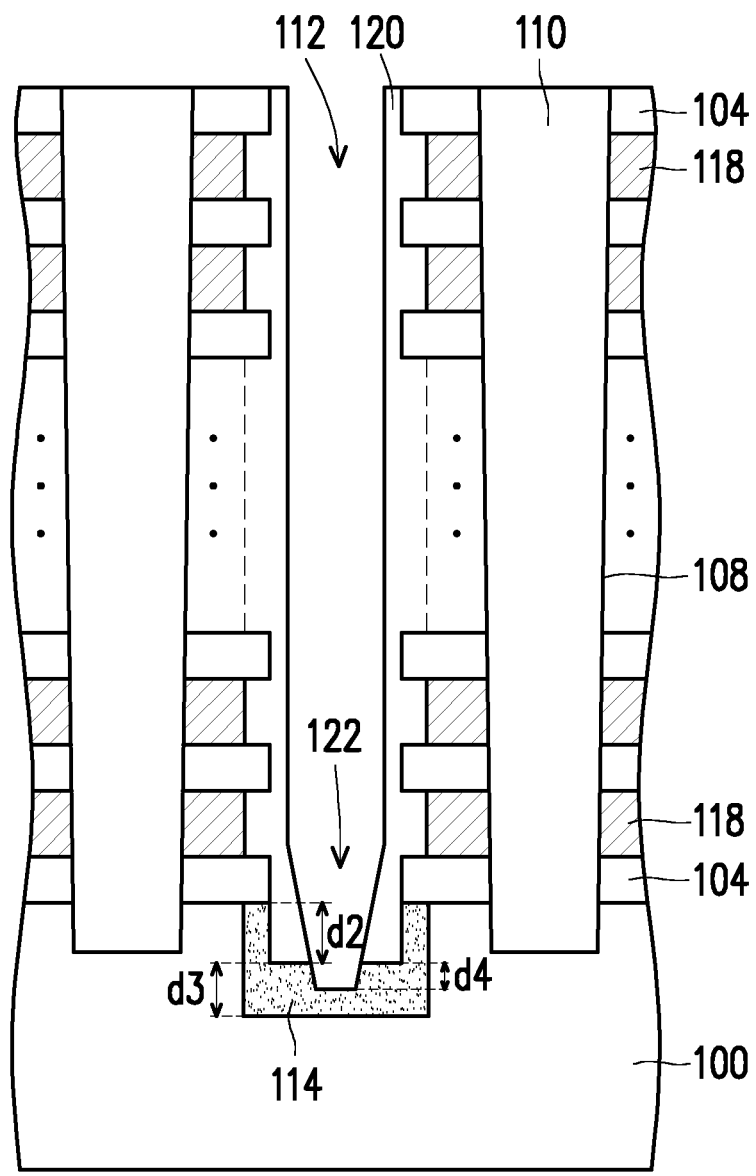

In FIG. 1D, isolating insulation layers 120 are formed on the inner surface of each of the slits 112. The isolating insulation layers 120 cover the sidewalls of the insulation layers 104 and the control gate layers 118, and also cover the surface of the substrate 100 exposed by the slits 112. Then, anisotropic etching is performed to etch the isolating insulation layers 120 covering the substrate 100 to form slit opening 122 having a width narrower than the width of the slit 112 and exposing the substrate 100, and the slit opening 122 extends into the substrate 100 to a fourth depth d4 of about 100-250 Å. The material of the above-mentioned isolating insulation layer 120 may be, for example, silicon oxide. The method for forming the isolating insulation layer 120 may be, for example, chemical vapor deposition, and the anisotropic etching above may be, for example, dry etching.

Figure 1E:
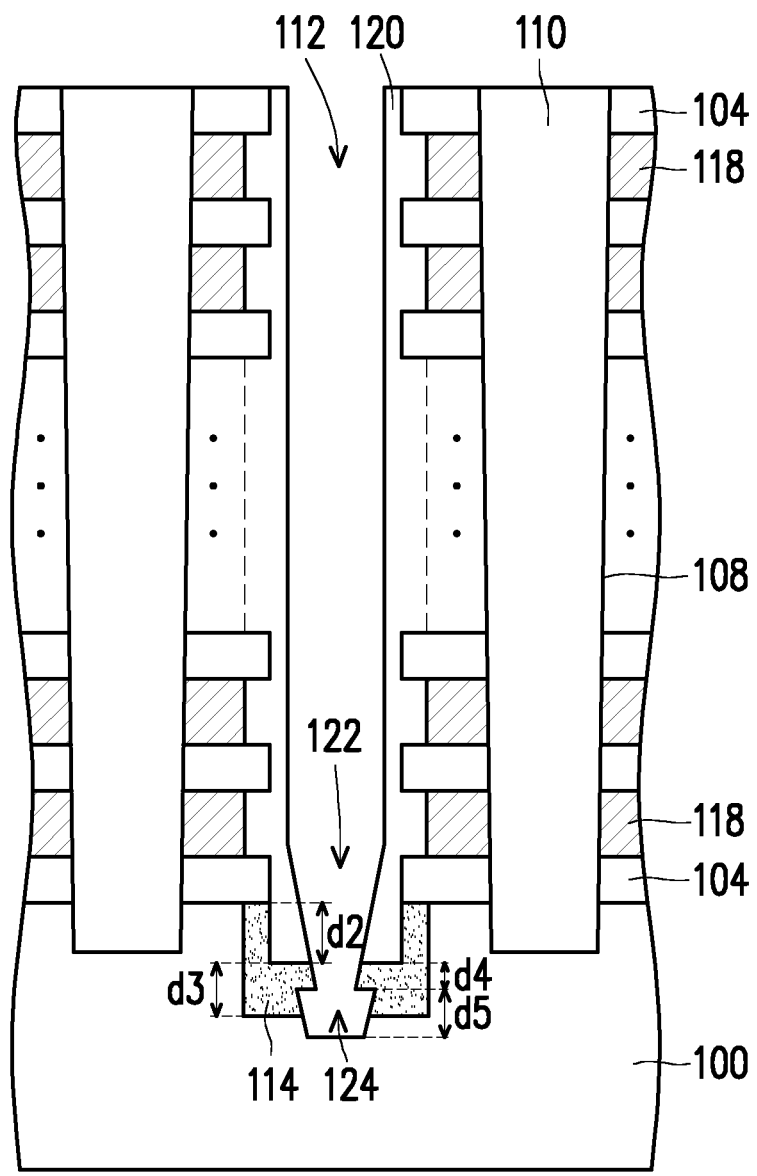

In FIG. 1E, cleaning the impurity doped regions 114 is performed, and the clean plasma is used to remove the exposed impurity doped regions 114 located under the exposed surface of the substrate 100 to form a bottom opening 124 extending into the substrate 100 to a fifth depth d5. The fifth depth d5 of the bottom opening 124 extending into the substrate 100, i.e. the height of the bottom opening 124, is about 30-800 Å, such as 30-700 Å, 30-600 Å, or 30-500 Å, to adequately remove the impurity doped regions 114 under the exposed surface of the substrate 100, so that the impurity concentration in the exposed surface layer of the substrate 100 may be significantly reduced to facilitate the later formation of metal silicide.

In this step, the applied bias electric field used to accelerate the clean plasma should not be too large, and may be 30-100 W such as 90, 80, 70, 60, 50, 40, or 30 W, and the plasma generator frequency is 0.1-60 MHz, such as 0.1, 0.3, 0.5, 0.7, 0.9, 1.2, 1.5, 2, 5, 10, 15, 20, 25, 30, 40, 50, or 60 MHz. Therefore, the exposed surface layer of the substrate 100 may be prevented from being damaged again after the removal of the impurity doped regions 114.

Since one of the main impurities of the impurity doped regions 114 is carbon, and the material of the substrate 100 is silicon, the gas source of the clean plasma includes a halogen-containing gas, such as $Cl_2$, $Br_2$, or HBr, to react with carbon and silicon to form volatile gas products, such as $CCl_4$, $CBr_4$, $SiCl_4$, and $SiBr_4$, to be carried away. The clean plasma gas source may also include a hydrogen-containing gas, such as $H_2$, to react with carbon, silicon, and fluorine to form volatile gas products, such as $CH_4$, $SiH_4$, and HF, to be carried away. In addition, the gas source of the clean plasma may also include an inert gas, such as $N_2$, He or Ar, to be used as a carrier gas.

Figure 1F:
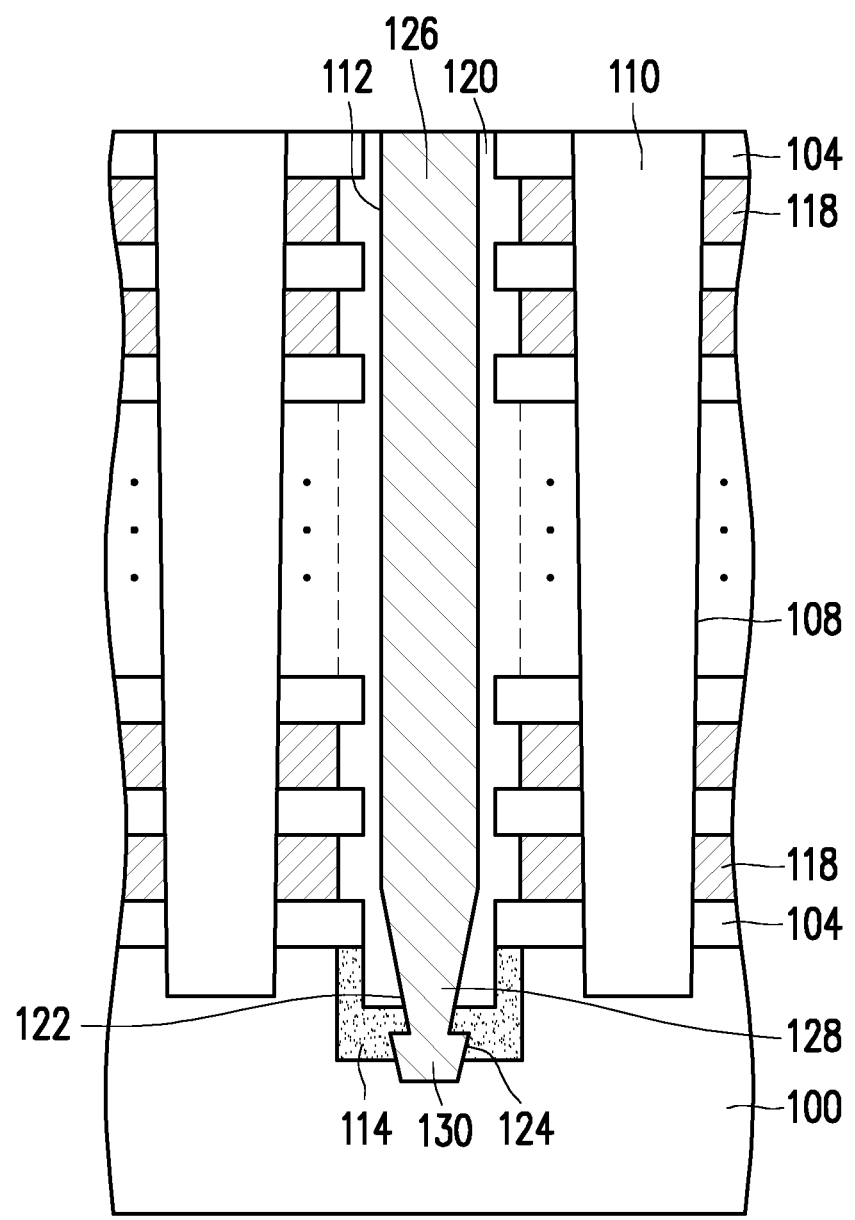

In FIG. 1F, a conductive plug 126, containing a metal barrier layer and a metal layer, is formed in the slit 112, the slit opening 122, and the bottom opening 124 to be used as a source line. It can be seen that the bottom end of the conductive plug 126 has a reduced neck structure 128 disposed in the slit opening 122, and an enlarged bottom structure 130 disposed in the bottom opening 124. The enlarged bottom structure 130 can increase the contact area of the conductive plug 126 and the substrate 100 to effectively reduce the contact resistance.

The material of the metal barrier layer may include Ti, TiN, or a combination thereof, and the material of the metal layer may include tungsten. The conductive plugs 126 may be formed by first forming a metal barrier layer and a metal layer by chemical vapor deposition, and then removing the excess metal barrier layer and the excess metal layer by chemical mechanical polishing (CMP) to form the conductive plugs 126. According to some embodiments, a portion of the metal barrier layer contacting the substrate 100 may react with the substrate 100 to form metal silicide to further reduce the contact resistance between the conductive plugs 126 and the substrate 100.

In summary, the above embodiment of the present disclosure adds a step of using clean plasma to clean the impurity doped regions formed in the slit etching step to reduce the contact resistance between the conductive plugs and the substrate. In addition, in the process of other semiconductor devices, if a substrate exposed by a deep trench having an aspect ratio of at least 30 has a problem of increased contact resistance caused by impurity doping, a clean plasma can also be used to remove the impurities entering the substrate to solve the resistance increase problem.

Although the present disclosure has disclosed the above embodiments, it is not intended to limit the present invention, and those skilled in the art can make some modifications and refinements without departing from the spirit and scope of the present invention. The scope of the invention is defined by the scope of the appended claims.

What is claimed is:

1. A semiconductor structure for a three-dimensional memory device, comprising:
   a stacked structure disposed on a substrate, wherein the stacked structure comprises a plurality of insulation layers and a plurality of control gate layers which are alternatively stacked, and the stacked structure has a plurality of channel openings vertically penetrating the stacked structure, and a plurality of slits between the adjacent two rows of the channel openings and vertically extending through the stacked structure;
   a plurality of channel pillars respectively located in the plurality of the channel openings and contacting the substrate, wherein the plurality of channel pillars each sequentially comprises a blocking insulation layer, a charge trapping layer, a tunneling insulation layer, a channel layer, and a core layer, from outside to inside;
   a plurality of isolating insulation layers respectively disposed on the inner walls of the plurality of the slits; and
   a plurality of conductive plugs respectively located between the plurality of isolating insulation layers, wherein a bottom part of each of the conductive plugs has a reduced neck structure and an enlarged bottom structure that extends into the substrate.

2. The semiconductor structure of claim 1, wherein the slit has an aspect ratio of 30-60.

3. The semiconductor structure of claim 1, wherein the slit has a depth of 3 to 12 μm.

4. The semiconductor structure of claim 1, wherein the enlarged bottom structure of the conductive plug extends into the substrate to a depth of 30-800 Å.

5. The semiconductor structure of claim 1, further comprising metal silicide disposed between the conductive plugs and the substrate.

6. The semiconductor structure of claim 1, further comprising a dielectric layer having a high dielectric constant and a metal barrier layer sequentially surrounding the insulation layer of the stacked structure.

7. A method of manufacturing a semiconductor structure for a three-dimensional memory device, comprising:
   forming a stacked structure on a substrate, wherein the stacked structure comprises a plurality of insulation layers and a plurality of sacrificial layers which are alternatively stacked;
   forming a plurality of channel openings vertically penetrating the stacked structure and exposing the substrate;

sequentially forming a blocking insulation layer, a charge trapping layer, a tunneling insulation layer, a channel layer, and a core layer, from outside to inside, in each of the plurality of the channel openings;

forming a plurality of slits vertically extending through the stacked structure and exposing the substrate, wherein the plurality of the slits are located between adjacent two columns of the channel openings, and each of the exposed substrate has an impurity doped region in the surface layer of the exposed substrate;

removing the plurality of sacrificial layers in the stacked structure;

forming a plurality of control gate layers between adjacent two of the insulation layers;

forming a plurality of isolating insulation layers on the inner surface of the plurality of the slits;

etching each of the isolating insulation layers on the surface of the substrate to form slit openings to expose the substrate;

removing the impurity doped region of the surface layer of the substrate to form a bottom opening; and forming a plurality of conductive plugs between the isolating insulation layers in each of the slits, wherein the conductive plugs each has a reduced neck structure located in the slit opening and an enlarged bottom structure located in the bottom opening.

8. The method of claim 7, wherein the removal of the impurity doped region comprises dry etching using a clean plasma.

9. The method of claim 8, wherein a biasing power of the accelerated electric field for the clean plasma is at most 100 W.

10. The method of claim 8, wherein when the impurities in the impurity doped region contains carbon and fluorine, the gas source of the clean plasma comprises a halogen-containing gas and a hydrogen-containing gas.

11. The method of claim 10, wherein
the halogen-containing gas comprises $Cl_2$, $Br_2$, or HBr; and
the hydrogen-containing gas comprises $H_2$.

12. The method of claim 10, wherein the gas source for cleaning the plasma further comprises an inert gas.

13. The method of claim 12, wherein the inert gas comprises $N_2$, He or Ar.

14. The method of claim 7, wherein the forming the plurality of conductive plugs further comprises forming a metal silicide on the surface of the substrate.

15. The method of claim 7, wherein the sacrificial layer is removed by isotropic etching.

16. The method of claim 7, further comprising forming a dielectric layer to surround the exposed insulation layer between removing the sacrificial layers and forming the conductive plugs.

17. The method of claim 16, further comprising forming a metal barrier layer on the dielectric layer between forming the dielectric layer and forming the conductive plugs.

* * * * *